United States Patent [19]

Houston

[11] 4,257,156

[45] Mar. 24, 1981

[54] METHOD FOR THERMO-COMPRESSION DIFFUSION BONDING EACH SIDE OF A SUBSTRATELESS SEMICONDUCTOR DEVICE WAFER TO RESPECTIVE STRUCTURED COPPER STRAIN BUFFERS

[75] Inventor: Douglas E. Houston, Ballston Lake, N.Y.

[73] Assignee: General Electric Company, Schenectady, N.Y.

[21] Appl. No.: 19,294

[22] Filed: Mar. 9, 1979

[51] Int. Cl.³ .................. B23K 20/14; H01L 21/58
[52] U.S. Cl. ........................ 29/580; 29/588; 29/591; 228/160; 228/188; 228/194; 228/263 A
[58] Field of Search ........... 228/188, 194, 195, 263 A, 228/211, 206, 160; 29/580, 588, 589, 590, 591

[56] References Cited

U.S. PATENT DOCUMENTS

| | | | |
|---|---|---|---|
| 3,237,272 | 3/1966 | Kallander | 29/589 |
| 3,295,089 | 12/1966 | Moore | 357/71 X |
| 3,657,611 | 4/1972 | Yoneda | 357/81 |
| 3,761,783 | 9/1973 | Kroger et al. | 29/589 X |
| 4,005,454 | 1/1977 | Froloff et al. | 29/589 X |
| 4,067,104 | 1/1978 | Tracy | 29/591 |
| 4,204,628 | 5/1980 | Houston et al. | 228/106 |

FOREIGN PATENT DOCUMENTS 622603 4/1977 U.S.S.R. .................. 228/193

OTHER PUBLICATIONS

Glascock et al., Published International Application WO 79/01012, Nov. 29, 1979 (priority date 11/6/1978).

Primary Examiner—Kenneth J. Ramsey
Attorney, Agent, or Firm—Marvin Snyder; James C. Davis

[57] ABSTRACT

A method is provided for thermo-compression diffusion bonding first and second structured copper strain buffers, respectively, directly to the two opposed surfaces of a substrateless semiconductor device wafer. The expensive tungsten or molybdenum support plate conventionally used to provide structural integrity to the relatively fragile semiconductor device wafer is thus eliminated. The method includes sandwiching the semiconductor device wafer between copper strand type strain buffers each having a lateral extent greater than the lateral extent of the wafer, diffusion bonding the strain buffers to the semiconductor device via first and second metallic coating layers, and removing most of the overhanging portions of the buffer which are not bonded to the wafer. A step of etching and passivating the edges of the wafer is also disclosed.

21 Claims, 4 Drawing Figures

METHOD FOR THERMO-COMPRESSION DIFFUSION BONDING EACH SIDE OF A SUBSTRATELESS SEMICONDUCTOR DEVICE WAFER TO RESPECTIVE STRUCTURED COPPER STRAIN BUFFERS

BACKGROUND OF THE INVENTION

This invention relates to methods for diffusion bonding surfaces together and, more particularly, to a method for thermo-compression diffusion bonding separate structured copper strain buffers directly to each side of a substrateless semiconductor device wafer.

DESCRIPTION OF THE PRIOR ART

When attaching a heat sink to a semiconductor device wafer, it is often desirable that this attachment occur as close to the semiconductor device wafer as possible in order to provide optimum heat removal from the wafer. Such is the case when a heat sink is attached via a structured copper strain buffer (a bundle of substantially parallel, closely packed filamentary strands of copper of substantially equal length, one common end thereof being thermo-compression diffusion bonded to a metallic sheet) to a semiconductor device wafer.

Prior high power semiconductor devices include a metallic support plate or substrate, typically comprised of tungsten or molybdenum, attached to one surface of a semiconductor device wafer to provide it with structural strength. Heat sinks are attached with thermo-compression diffusion bonds via structured copper strain buffers to one or both sides of such wafer-support plate structures. A bonding press capable of producing such thermocompression diffusion bonds is described in Douglas Houston U.S. patent application Ser. No. 927,344, filed July 24, 1978, now abandoned in favor of divisional application Ser. No. 139,177, filed Apr. 11, 1980 and assigned to the instant assignee.

A method for thermo-compression diffusion bonding a structured copper strain buffer to a semiconductor device wafer supported by a tungsten or molybdenum support plate is described and claimed in Glascock et al. U.S. patent application Ser. No. 958,100, filed Nov. 6, 1978 and assigned to the instant assignee. It is desirable, however, to diffusion bond respective heat sinks via structured copper strain buffers "directly" to each surface of the semiconductor device wafer thereby eliminating the rather expensive support plate. The term "directly" as used herein signifies that actually such bonds are made to metalized layers situated on the major opposed surfaces of the wafer, and not to the wafer itself. Several high power semiconductor devices including heat sinks attached via structured copper strain buffers thermo-compression diffusion bonded "directly" to a silicon device wafer without use of a tungsten or molybdenum support plate are described and claimed in the aforementioned Glascock et al. patent application.

In accordance with the present invention, one method for accomplishing such thermo-compression diffusion bonds "directly" to each side of a semiconductor device wafer unsupported by a support plate is provided. It will be apparent to those skilled in the art that improved electrical and thermal performance are to be gained by the elimination of the tungsten or molybdenum support plate which results from the "direct" diffusion bonding of heat sinks via structured copper strain buffers to both sides of a semiconductor device wafer.

My copending patent application, Ser. No. 19,224, filed Mar. 9, 1979 and assigned to the instant assignee, describes and claims a method for "direct" diffusion bonding a heat sink via a structured copper strain buffer to one side of a semiconductor device wafer.

My copending patent application, Ser. No. 18,653, filed Mar. 8, 1979 assigned to the instant assignee, describes and claims an improved apparatus and method for "direct" diffusion bonding heat sinks via structured copper strain buffers to both sides of a semiconductor device wafer.

It is one object of the present invention to provide a method for thermo-compression diffusion bonding separate structured copper strain buffers "directly" to each of the two opposed surfaces of a semiconductor device wafer without requiring an intermediate support plate to strengthen the wafer.

It is a further object of the invention to provide a method for more efficiently removing heat from a semiconductor device wafer.

It is another object of the invention to provide a method for thermo-compression diffusion bonding separate structured copper strain buffers to each side of a semiconductor device wafer without causing wafer fracture.

BRIEF SUMMARY OF THE INVENTION

The present invention is directed to increasing the conduction of heat away from a semiconductor device wafer having structured copper strain buffers respectively bonded to each of the two major opposed surfaces thereof. By "directly" diffusion bonding strain buffers to the wafer, need for the support plate attached to the semiconductor device is eliminated.

Briefly, in accordance with one preferred embodiment of the invention, a method for thermo-compression diffusion bonding first and second structured copper strain buffers to a substrateless semiconductor device wafer having two major opposed surfaces and an outer edge surface is provided. A substrateless semiconductor device wafer is defined to be one which has no support plate attached thereto. Each of these major surfaces is smoothened and then coated with respective separate metallic layers. Each metallic layer is coated with a metallization. The first and second structured copper strain buffers each include a bundle of substantially parallel, closely packed strands of copper of substantially equal length having one common end thereof thermo-compression diffusion bonded to a metallic sheet while one common end of the copper strands opposite the metallic sheet of each of the first and second structured copper strain buffers is to be thermo-compression diffusion bonded to each of the two metallized major surfaces of the semiconductor device wafer, respectively.

The semiconductor device wafer is sandwiched between the first and second structured copper strain buffers. The surface of each strain buffer opposite its respective metallic sheet is positioned facing each major surface of the wafer, respectively. The first and second structured copper strain buffers extend laterally beyond the lateral extent of the semiconductor device wafer and are positioned so as to overhang the entire outer edge surface of the wafer.

The so positioned semiconductor device wafer and structured copper strain buffers are surrounded with an inert atmosphere and squeezed together at high pressure. The semiconductor device wafer and structured copper strain buffers are heated at a temperature within the range of 300° C. to 400° C. while the same are squeezed together.

In an alternative embodiment of the invention, first and second structured copper strain buffers are thermo-compression diffusion bonded to each of the two metallized major surfaces of a semiconductor device wafer. The outer edge surface of the semiconductor device wafer is beveled preferably prior to sandwiching the semiconductor device wafer between the first and second structured copper strain buffers. The separate metallic layers and metallizations are applied to each of the opposed surfaces of the semiconductor device wafer as previously set forth, but with the metallic layers and metallizations having a lateral extent sufficiently small to avoid overlapping the beveled surface. The metallic layer and metallization on the surface of the wafer which is beveled are axially aligned with each other and with the metallic layer and metallization on the opposite surface of the wafer, which likewise are axially aligned with each other. All metallic layers and metallizations are formed with an equal lateral extent. The semiconductor device wafer is then sandwiched between the first and second strain buffers and the semiconductor device wafer and first and second structured copper strain buffers are squeezed together while being heated in an inert atmosphere, as described above. The metallic sheet of the first structured copper strain buffer is thereafter cut, preferably with a laser beam to remove the portion of the first strain buffer not bonded to the semiconductor device wafer. The beveled edge surface of the wafer is cleaned, typically by sputter etching, and is then passivated. Thermo-compression diffusion bonds are thus formed between the two major opposed surfaces of the beveled semiconductor device wafer and respective first and second structured copper strain buffers without wafer fracture.

The features of the invention believed to be novel are set forth with particularity in the appended claims. The invention itself, however, both as to organization and method of operation, together with further objects and advantages thereof, may best be understood by reference to the following description taken in conjunction with the accompanying drawings.

DETAILED DESCRIPTION OF THE PREFERRED EMBODIMENT

Figure 1:
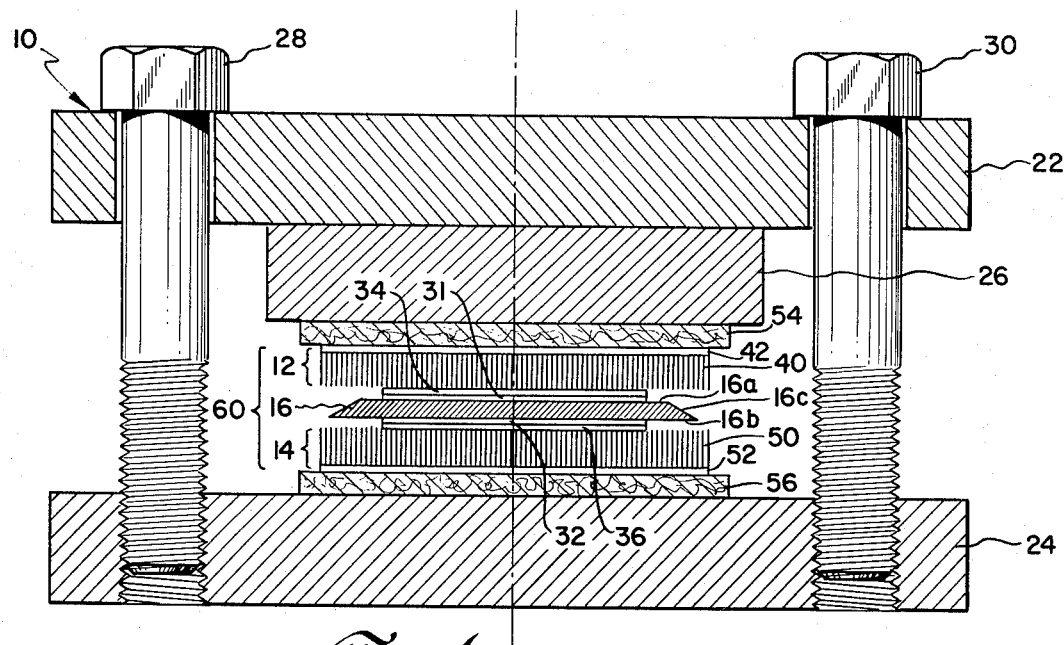
FIG. 1 is a cross-sectional view of a thermocompression diffusion bonding press showing materials situated in the press to be bonded together in practicing the invention.

FIG. 1 shows a diffusion bonding press 10 suitable for thermo-compression diffusion bonding a first structured copper strain buffer 12 and a second structured copper strain buffer 14, respectively, to the opposed major surfaces 16a and 16b of substrateless semiconductor device wafer 16. The outer edge surface 16c of semiconductor device wafer 16 is preferably beveled, as shown in FIG. 1, although the invention encompasses wafers both with and without a beveled outer edge surface.

A diffusion bonding press such as press 10 is described in the aforementioned Houston patent application Ser. No. 139,177, the disclosure thereof being incorporated herein by reference. Press 10 is comprised of an upper metallic plate 22 oriented parallel to a lower metallic plate 24 with a space provided therebetween. A metallic pressing block 26 is positioned at the center of the side of upper plate 22 facing lower plate 24. Metallic bolts 28 and 30 pass through respective holes in upper plate 22 and lower plate 24 and are threaded into lower plate 24 to connect the two plates together as illustrated in FIG. 1.

Metallic bolts 28 and 30 are comprised of a steel other than stainless steel, while upper plate 22, lower plate 24 and metallic pressing block 26 are comprised of stainless steel. Metallic pressing block 26 may alternatively be comprised of Dural, an aluminum alloy, and other metals having a coefficient of thermal expansion greater than that of steel.

To achieve the respective thermo-compression diffusion bonds between strain buffers 12 and 14 and wafer 16, surfaces 16a and 16b are smoothened to remove surface damage therefrom. Such surface damage would otherwise cause nonuniform distribution of pressures within wafer 16 and thus wafer breakage when wafer 16 is subjected to the high pressures employed in the thermo-compression diffusion bonding process of the invention. This step of smoothing may be accomplished, for example, by polishing or etching surfaces 16a and 16b.

Metallic layers 31 and 32 are applied to wafer surfaces 16a and 16b, respectively. Each of metallic layers 31 and 32 is comprised of one of such metals as titanium, chromium and nickel. Metallizations 34 and 36 are respectively applied over metallic layers 31 and 32. Each of metallizations 34 and 36 are respectively comprised of one of such metals as copper, gold and silver. These metallic layers and metallizations may be applied to wafer 16 by sputtering or evaporation, for example.

The wafer-metallic layer-metallization structure thus formed is sandwiched between structured copper strain buffers 12 and 14. Structured copper strain buffer 12 is comprised of a bundle of substantially parallel, closely packed strands of copper 40 of substantially equal length with one common end thereof thermo-compression diffusion bonded to a metallic sheet 42, typically comprised of copper. The opposite common end of copper strands 40 is positioned in abutment with metallization 34. Structured copper strain buffer 14 is essentially identical to structured copper strain buffer 12 and is comprised of copper strands 50 and metallic sheet 52. The common end of copper strands 50 opposite metallic sheet 52 is positioned in abutment with metallization 36.

A layer 54 of nonreactive compactible material is situated in abutment with metallic sheet 42 of structured copper strain buffer 12. Layer 54 may be comprised of glass wool or Glass Fiber Filter paper available from Fisher Scientific Company, Clifton, N.J., or other similarly compactible material. A layer of compactible material 56 preferably comprised of the same material as layer 54 is positioned in abutment with metallic sheet 52 of structured copper strain buffer 14.

The combined structure formed by semiconductor device wafer 16, structured copper strain buffers 12 and 14, and metallic layers 31 and 32 and metallizations 34 and 36 disposed therebetween and compactible layers 54 and 56 is positioned in press 10 between pressing block 26 and lower plate 24. A conventional press (not shown) is used to squeeze upper plate 22 and lower plate 24 together and while such pressure is applied to these plates, bolts 28 and 30 are tightened.

The thermo-compression diffusion bonds between structured copper strain buffer 12 and wafer 16, and between structured copper strain buffer 14 and wafer 16 are actually formed when press 10 containing the abovedescribed combined structure, illustrated in FIG. 1, is surrounded by an inert atmosphere and heated at a temperature within the range of 300° C. to 400° C., typically 325° C., for approximately 15 minutes to 5 hours. When press 10 is heated in this manner, upper plate 22, lower plate 24 and metallic pressing block 26 expand to a greater total extent than do metallic bolts 28 and 30. Therefore, a force is exerted between pressing block 26 and lower plate 24, resulting in the squeezing of structured copper strain buffers 12 and 14 and semiconductor device wafer 16 together and the thermo-compression diffusion bonding of buffers 12 and 14 to wafer 16. The now-formed strain buffer-wafer assembly 60 is removed from press 10 by loosening bolts 28 and 30. Although reference is made herein to the thermo-compression diffusion bonding of strain buffer 12 to wafer 16 and strain buffer 14 to wafer 16 for simplicity of description, those skilled in the art will appreciate that the actual thermo-compression diffusion bonds are formed at the interface between the common end of copper strands 40 and metallization 34, and at the interface between the common end of copper strands 50 and metallization 36.

During thermo-compression diffusion bonding, substrateless semiconductor device wafer 18 is subjected to high pressures, specifically, 20,000 psi to 50,000 psi. If this force is not purely compressive, that is, if semiconductor device wafer 16 is subjected to bowing or tensile forces, wafer 16 will likely fracture, resulting in a damaged semiconductor device. It is thus extremely important that uniform high pressure be applied over the entire wafer 16.

Prior methods of thermo-compression diffusion bonding used a support plate attached to the semiconductor device wafer to enable the wafer to withstand some degree of bowing forces and nonuniform pressure without fracture. When attempting thermo-compression diffusion bonding of members to a "substrateless" semiconductor device wafer, it is important that the surfaces of the members to be bonded together be flat and parallel to each other and to the opposed facing surfaces of lower plate 24 and metallic pressing block 26. To solve the problem of bowing forces being generated near the edge surface of wafer 16 during thermo-compression diffusion bonding as would occur if strain buffers 12 and 14 did not extend over the entire lateral extent of wafer 16, the lateral extent of structured copper strain buffers 12 and 14 is made greater than the lateral extent of wafer 16 such that buffers 12 and 14 overhang wafer 16 around the entirety of its edge surface.

Layers of compactible material 54 and 56 are positioned as described above to assure that during thermo-compression diffusion bonding, structured copper strain buffer 12 does not adhere undesirably to pressing block 26 and to assure that structured copper strain buffer 14 similarly does not bond to lower plate 24. Use of such layers of compactible material helps assure the creation of uniform, substantially void-free diffusion bonds. Voids in diffusion bonds may result when a thermo-compression diffusion bond between a compliant metallic member (such as a structured copper strain buffer) and another member having some degree of surface irregularity is attempted. When compressed, the layers of compactible material fill in the irregularities in the surface of the respective structured copper strain buffers allowing the diffusion bonding press 10 to apply a more evenly distributed pressure to the members which are to be bonded together. Use of layers of compactible material 54 and 56 is preferable but not essential to practice of the method of the invention. A method employing such layers of compactible material to substantially prevent the creation of voids in materials thermo-compression diffusion bonded together is described and claimed in Houston et al., Ser. No. 927,346, filed July 24, 1978 and assigned to the instant assignee, the disclosure thereof being incorporated herein by reference.

Figure 2:
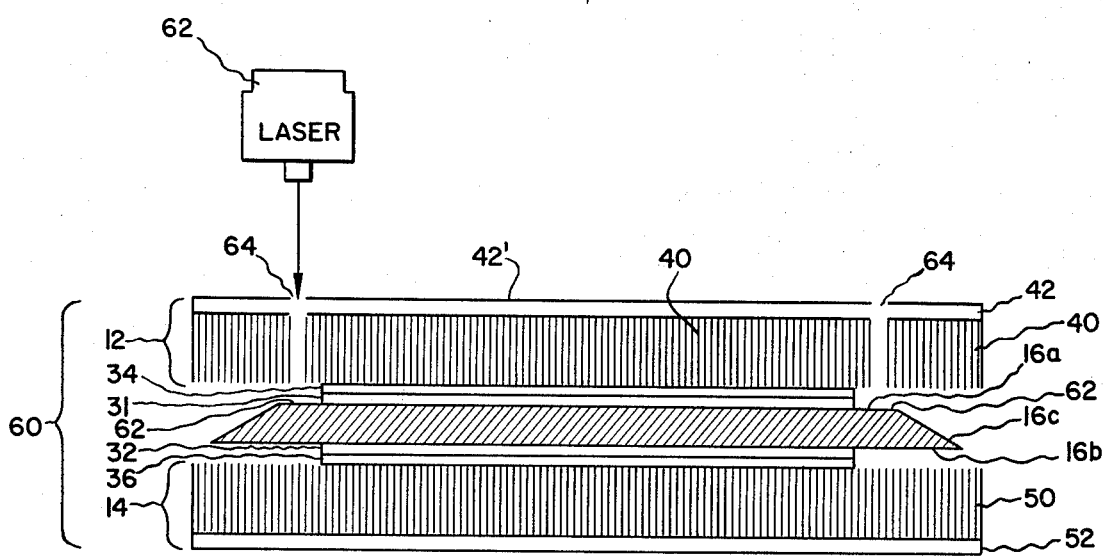
FIG. 2 illustrates laser cutting of a portion of a structured copper strain buffer in preparation for passivating the semiconductor device wafer diffusion bonded thereto.

If semiconductor device wafer 16 is of the nonbeveled variety, no further processing in accordance with the invention is required. However, if wafer 16 includes a beveled outer edge surface 16c, as illustrated, it is desirable that surface 16c be cleaned and passivated to protect it from external contamination. As shown in FIG. 2, beveled edge surface 16c lies recessed under structured copper strain buffer 12 and is thus inaccessible for cleaning and passivation purposes. It would be undesirable to passivate beveled surface 16c prior to thermo-compression diffusion bonding since the additional thickness of the passivant, which would likely become affixed to the outer edge of wafer surfaces 16a and 16b would cause uneven pressure on the wafer during such diffusion bonding and likely result in fracturing the wafer. Therefore, passivation of beveled surface 16c is achieved in the following manner. Prior to sandwiching wafer 16 between structured copper strain buffers 12 and 14, metallic layers 31 and 32, applied to major surfaces 16a and 16b, respectively, of wafer 16, are formed with a lateral extent sufficiently small so as to avoid overlapping beveled surface 16c. That is, the lateral extent of layers 31 and 32 may be equal to or less than the lateral extent of surface 16a. Metallizations 34 and 36 are thereafter applied over metallic layers 31 and 32, respectively, with lateral extents equal to those of metallic layers 31 and 32, all of the above-mentioned lateral extents being equal and axially aligned with each other, as shown in FIG. 2.

When the thermo-compression diffusion bonding process is carried out upon the metallized wafer structure 16, the common end of copper strands 40 opposite metallic sheet 42 of strain buffer 12 becomes thermo-compression diffusion bonded only to the metallized portions of surface 16a. Similarly, the common end of copper strands 50 opposite metallic sheet 52 of strain buffer 14 diffusion bonds only to metallized portions of surface 16b.

Figure 3:
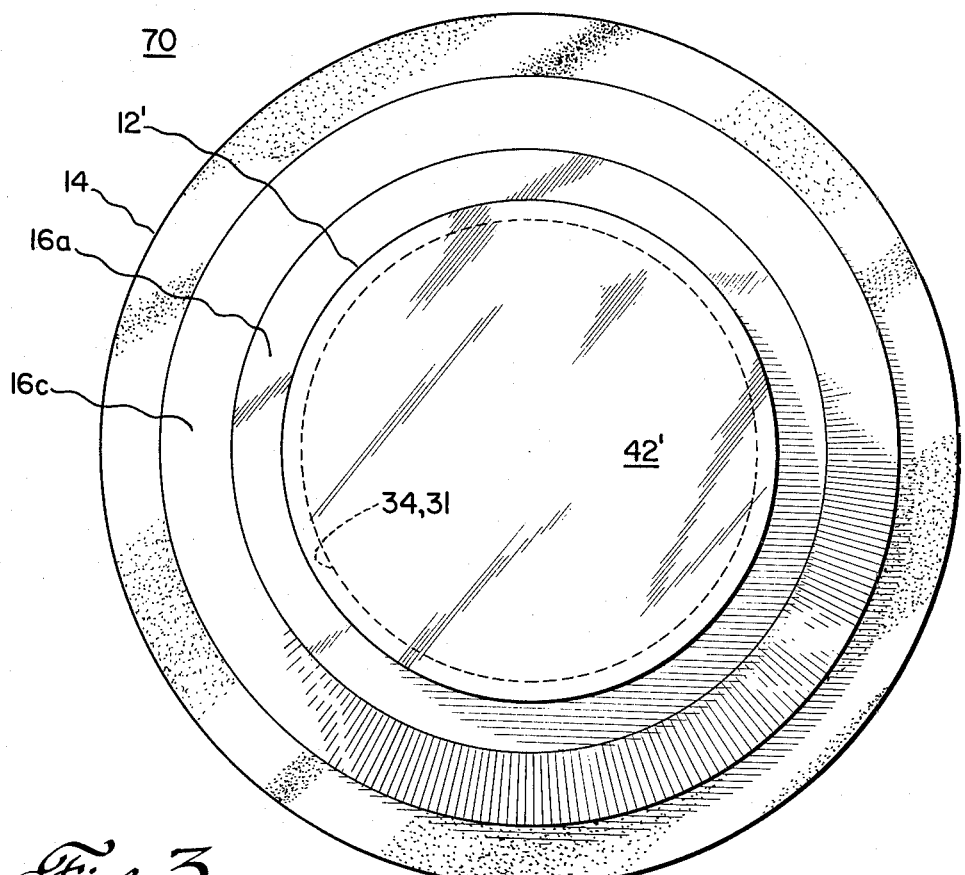
FIG. 3 is a top view of the bonded semiconductor device wafer-strain buffer structure shown in FIG. 2 after removal of the portions of the strain buffer cut away by the laser.

A laser device 62 such as a pulsed laser, typically having a peak pulsed power of 16 KW although not limited thereto, generates a beam of coherent light which is directed along a selected path on metallic sheet 42 of strain buffer wafer assembly 60, fabricated as previously described, so as to form an incision 64 in sheet 42 and thus allow the removal of most of the portion of strain buffer 12 not bonded to wafer metallization 34. The portion of structured copper strain buffer 12 outside incision 64 is removed to form wafer-buffer structure 70 shown in FIG. 3. The remaining portion of strain buffer 12 is designated strain buffer 12'. Beveled edge surface 16c is thus made accessible for cleaning and passivation.

Chemically etching the surface of a beveled semiconductor device wafer is a method for wafer cleaning well known in the art. However, such an etching step, if applied to wafer-buffer structure 70 would result in the undesirable chemical attack of the structured copper strain buffers 12 and 14 by the etchant. Rather, beveled surface 16 is subjected to sputter etching to remove contaminants therefrom prior to passivation.

Figure 4:
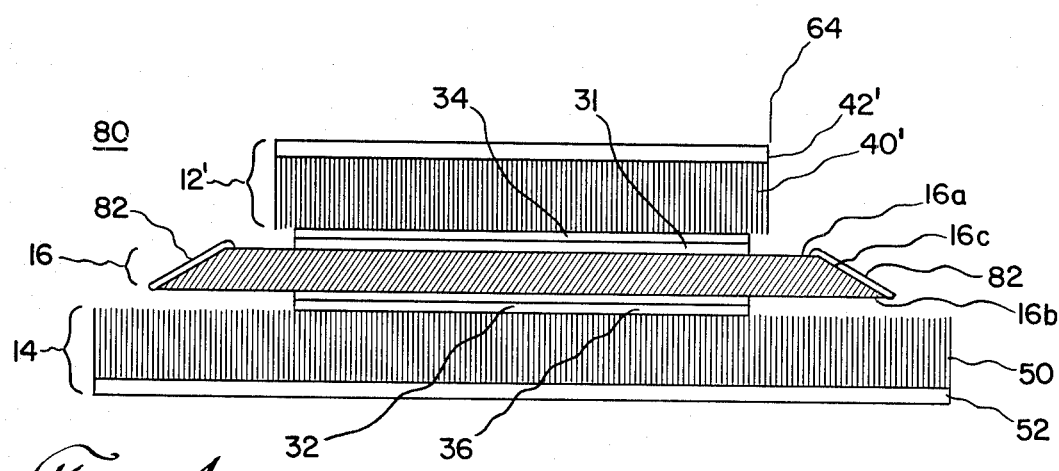
FIG. 4 is a cross-sectional side view of the wafer-strain buffer structure shown in FIG. 3, after passivation.

Subsequently, beveled surface 16c is coated with a passivation layer 82 comprised of one of the many passivation materials known in the art, polyimide siloxane, for example, as illustrated in FIG. 4.

To complete the device thus formed, heat sinks (not shown) are respectively attached to metallic layers 42 and 52 of strain buffers 12' and 14. This is preferably accomplished by thermo-compression diffusion bonding during the course of attachment of strain buffers 12 and 14 to wafer 16 or at a later time. Although heat sink attachment may be accomplished by other means of joining metals together, soldering, for example, thermo-compression diffusion bonding is preferred because it inherently achieves superior thermal conductivity between the joined metallic members.

Practice of the invention is not limited to the particular circular geometries shown for the wafers, strain buffers, and various other layers depicted in the drawings for purposes of example. Rather, other geometric forms of these members such as squares, rectangles, polygons, etc., may alternatively be used in practicing of the invention.

The foregoing describes a method for thermo-compression diffusion bonding separate structured copper strain buffers directly to each of the two major opposed surfaces, respectively, of substrateless semiconductor device wafer. Such bonding is achieved without wafer fracture. The method accommodates both beveled and nonbeveled semiconductor device wafers.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

What is claimed is:

1. A method for thermo-compression diffusion bonding first and second structured copper strain buffers to a substrateless semiconductor device wafer having two major opposed surfaces and an outer edge surface, said first and second structured copper strain buffers each including a bundle of substantially parallel, closely packed strands of copper of substantially equal length having one common end thereof thermo-compression diffusion bonded to a metallic sheet, said method comprising:

applying first and second metallic layers, respectively, over the first and second major opposed surfaces of said semiconductor device wafer;

applying first and second metallizations, respectively, over said first and second metallic layers;

sandwiching said semiconductor device wafer between said first and second structured copper strain buffers, the surface of each structured copper strain buffer opposite the respective metallic sheet thereof being positioned facing said wafer, said structured copper strain buffers each having a lateral extent greater than the lateral extent of said semiconductor device wafer and being so positioned as to overhang the entire outer edge surface of said semiconductor device wafer;

surrounding the so positioned semiconductor device wafer and structured copper strain buffers with an inert atmosphere;

applying a loading force to squeeze together at high pressure said so positioned semiconductor device wafer and structured copper strain buffers;

heating said so positioned semiconductor device wafer and structured copper strain buffers at a temperature within the range of 300° C. to 400° C. while said loading force is applied; and thereafter removing most of the portion of said first structured copper strain buffer not bonded to said semiconductor device wafer.

2. The method of claim 1 wherein said first and second metallic layers are comprised of one of the group consisting of titanium, chromium and nickel, and said first and second metallizations are comprised of one of the group consisting of copper, silver and gold.

3. The method of claims 1 or 2 wherein said high pressure is within the range of approximately 20,000 to 50,000 psi.

4. The method of claim 3 including the step of smoothing said first and second major opposed surfaces prior to applying said first and second metallic layers thereon, respectively.

5. The method of claim 4 wherein the step of smoothing is accomplished by polishing said first and second major opposed surfaces.

6. The method of claim 4 wherein the step of smoothing is accomplished by etching said first and second major opposed surfaces.

7. The method of claim 4 including the step of positioning first and second layers of nonreactive compactible material in abutment, respectively, with the metallic sheets of said first and second structured copper strain buffers, prior to application of said loading force.

8. The method of claims 1 or 2 including the step of positioning first and second layers of nonreactive compactible material in abutment, respectively, with the metallic sheets of said first and second structured copper strain buffers, prior to application of said loading force.

9. The method of claim 1 including the step of beveling the outer edge of said semiconductor device wafer to form a beveled edge surface prior to sandwiching said semiconductor device wafer between said first and second structured copper strain buffers, said first structured copper strain buffer being positioned facing said beveled surface.

10. The method of claim 9 wherein the step of applying said first and second metallic layers comprises depositing first and second metallic layers having a lateral extent less than the lateral extent of said wafer and sufficiently small so as to avoid overlapping said beveled surface, said first and second metallic layers being axially aligned with each other.

11. The method of claim 10 wherein the step of applying said first and second metallizations comprises depositing said first and second metallizations in such manner that said metallizations are axially aligned with said metallic layers and have a lateral extent equal to the lateral extent of said metallic layers.

12. The method of claim 11 wherein said first and second metallic layers are comprised of one of the group consisting of titanium, chromium and nickel, and said first and second metallizations are comprised of one of the group consisting of copper, silver and gold.

13. The method of claim 11 wherein said first and second major opposed surfaces are smoothened prior to applying said first and second metallic layers thereon, respectively.

14. The method of claim 13 wherein the step of smoothing is accomplished by polishing said first and second major opposed surfaces.

15. The method of claim 13 wherein the step of smoothing is accomplished by etching said first and second major opposed surfaces.

16. The method of claims 9 or 13 wherein the step of removing most of the portion of said first structured copper strain buffer not bonded to said semiconductor device wafer after heating said wafer comprises cutting with a laser beam the metallic sheet of said first structured copper strain buffer.

17. The method of claim 16 including the step of positioning first and second layers of compactible material in abutment, respectively, with the metallic sheets of said first and second structured copper strain buffers prior to application of said loading force.

18. The method of claim 9 wherein said high pressure is within the range of approximately 20,000 to 50,000 psi.

19. The method of claim 9 including the step of positioning first and second layers of compactible material in abutment, respectively, with the metallic sheets of said first and second structured copper strain buffers prior to application of said loading force.

20. The method of claim 1 including the step of sputter etching said beveled edge surface of said semiconductor device wafer after cutting said metallic sheet.

21. The method of claim 20 including the step of passivating said beveled edge after sputter etching said beveled edge.

* * * * *